(12) United States Patent
Nagahama

(10) Patent No.: US 6,378,034 B1
(45) Date of Patent: Apr. 23, 2002

(54) MICROCOMPUTER WITH FLASH EEPROM HAVING AUTOMATIC COMMUNICATION MODE DETERMINING FUNCTION

(75) Inventor: Kenichi Nagahama, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/407,656

(22) Filed: Sep. 28, 1999

(30) Foreign Application Priority Data

Oct. 9, 1998 (JP) .......................................... 10-288212

(51) Int. Cl.$^7$ .............................................. G06F 12/02
(52) U.S. Cl. ...................................................... 711/103
(58) Field of Search ................................ 711/103, 154; 365/185.02

(56) References Cited

U.S. PATENT DOCUMENTS

| | | | |
|---|---|---|---|
| 5,677,873 A | * 10/1997 | Choi et al. ............. | 365/185.17 |
| 6,128,221 A | * 10/2000 | Chih ...................... | 365/185.18 |
| 6,166,960 A | * 12/2000 | Marnewech et al. ... | 365/185.28 |

FOREIGN PATENT DOCUMENTS

| | | |
|---|---|---|
| JP | 57-45941 | 3/1982 |
| JP | 63-106851 | 5/1988 |
| JP | 64-25268 | 1/1989 |
| JP | 5-266219 | 10/1993 |
| JP | 5-266220 | 10/1993 |
| JP | 6-111032 | 4/1994 |
| JP | 7-028772 | 1/1995 |
| JP | 8-227359 | 9/1996 |
| JP | 9-134339 | 5/1997 |
| JP | 10-050086 | 2/1998 |

* cited by examiner

*Primary Examiner*—Kevin L. Ellis
(74) *Attorney, Agent, or Firm*—Hayes Soloway P.C.

(57) ABSTRACT

An automatic communication mode determining circuit determines, when a flash programming mode signal becomes active, a communication mode indicated by a communication mode selection signal, and an associated communication mode signal is fed to a communication mode signal bus. In a terminal circuit corresponding to the communication mode, a selector selects the associated communication mode, and an input buffer control signal activates an input buffer. For a terminal for which it is not known that the terminal is used in accordance with a communication mode, the output (communication mode signal) from the communication mode signal bus is selected in the flash programming mode to be outputted as the input buffer control signal. This causes the input buffer associated with the terminal not used in the flash programming mode to turned off to prevent a current from flowing through the input buffer.

9 Claims, 6 Drawing Sheets

MICROCOMPUTER WITH FLASH EEPROM HAVING AUTOMATIC COMMUNICATION MODE DETERMINING FUNCTION

BACKGROUND OF THE INVENTION

1. Field of the Invention

The present invention relates to a microcomputer with an electrically erasable and programmable read-only memory (EEPROM).

2. Description of the Related Art

Conventional microcomputers of this type have several communication modes to communicate programming data in a flash programming mode. The user selects a particular communication mode for the flash programming.

In the aforementioned microcomputer, a terminal not used in the flash programming mode requires a terminal circuit exclusively used in the flash programming mode to prevent a current from flow through an input buffer associated with the terminal.

This leads to a problem that the number of parts on a substrate of the microcomputer is increased, the cost thereof soars, and the substrates becomes larger for the following reasons. The communication mode to be selected in the flash programming mode by the user is unknown, and hence the terminal not to be used cannot be determined. Therefore, the input buffer associated with a terminal which may possibly be used in the flash programming mode must be turned on regardless of whether the terminal is actually selected or not.

SUMMARY OF THE INVENTION

It is an object of the present invention to provide a microcomputer with a flash EEPROM which does not require a terminal circuit exclusively used in the flash programming mode.

According to one aspect of the present invention, a microcomputer with a flash EEPROM comprises an automatic communication mode determining circuit for determining a communication mode in a flash programming mode and for setting a communication mode signal of the communication mode thus determined to an active level, and control circuits associated with respective input terminals for setting in the flash programming mode, when a communication mode signal of a communication mode corresponding to the input terminal is at an active level, an input buffer associated with the input terminal to an active state.

The automatic communication mode determining circuit automatically determines, in the flash programming mode, a communication mode to be employed in the flash programming, generates a communication mode signal, and delivers the signal to a communication mode signal bus.

To achieve the flash programming, there are provided several communication modes to communicate programming data. For example, two communication modes of a three-wire serial interface (hereinafter referred to as CSI) and an asynchronous serial interface (hereinafter referred to as UART) are provided, and the user selects either one thereof to communicate programming data in the flash programming.

In this case, since CSI terminals or UART terminals are selected by the user, it is impossible to determine beforehand which one will be used.

For a terminal which may be used or may not be used depending on a communication mode, an output (a communication mode signal) is acquired from the communication mode signal bus in the flash programming mode and is outputted as an input buffer control signal. This causes an input buffer associated with the terminal not used in the flash programming to turn off to thereby prevent a current from flow through the input buffer.

For a terminal for which it is known beforehand that the terminal is not used, an input buffer inactive level signal is selected in the flash programming mode to be delivered as an input buffer control signal. This causes an input buffer of the terminal not used in the flash programming to turn off to thereby prevent a current from flowing through the input buffer.

Since a current is prevented from flowing through the input buffer without any terminal processing on a substrate, a terminal circuit exclusively used in the flash programming mode can be dispensed with on the substrate. This leads to a reduction in cost and size of the substrate of the microcomputer.

According to another aspect of the present invention, a microcomputer with a flash EEPROM comprises, in place of the automatic communication mode determining circuit, communication mode selecting signal input terminals for each communication mode. In the flash programming mode, when an active communication mode signal is supplied from the communication mode selecting signal input terminal of a communication mode associated with the pertinent input terminal, the input buffer associated with the-input terminal is activated.

The above and other objects, features, and advantages of the present invention will become apparent from the following description with reference to the accompanying drawings which illustrate examples of the present invention.

DESCRIPTION OF THE PREFERRED EMBODIMENTS

First Embodiment

Figure 1:
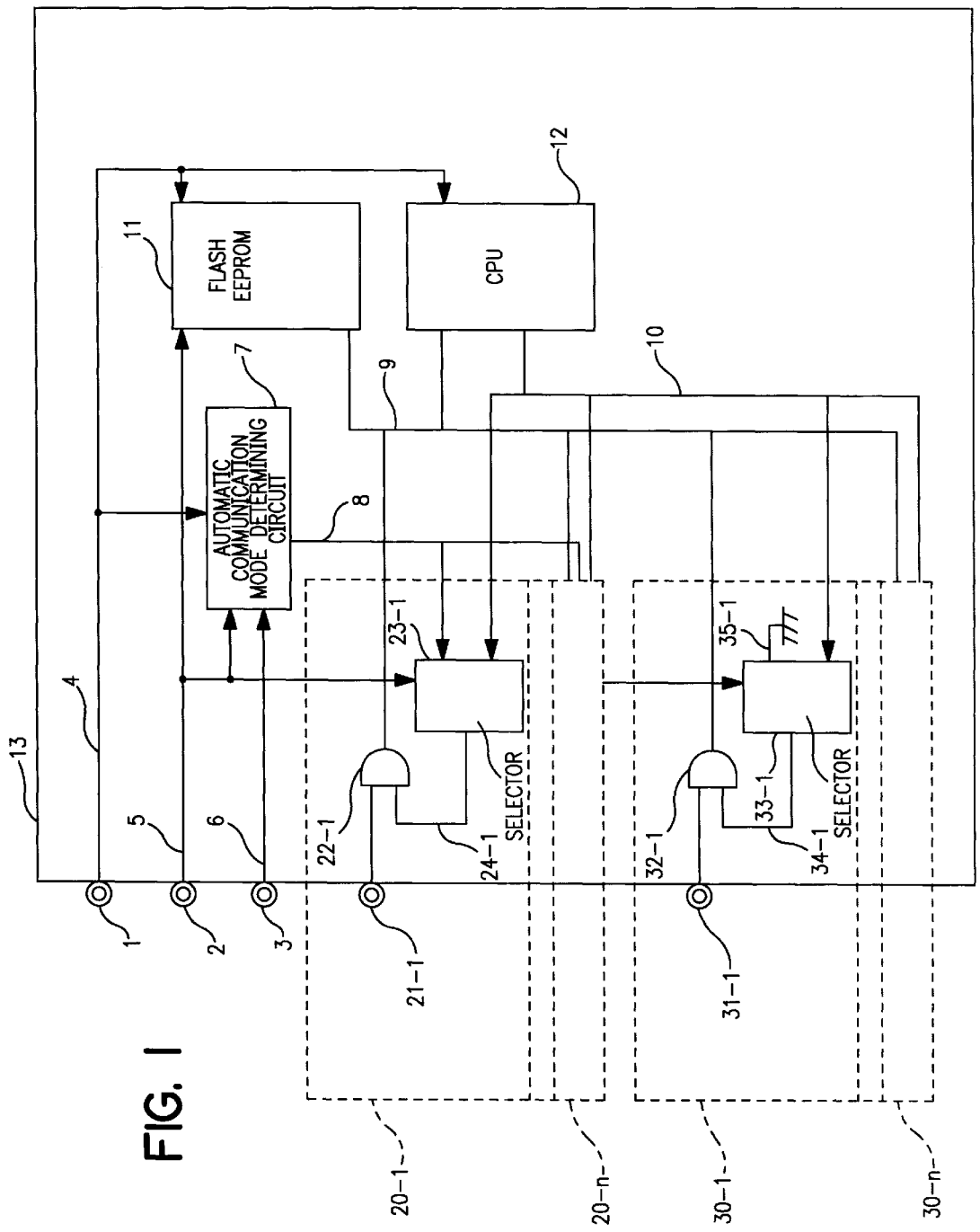
FIG. 1 is a schematic block diagram showing a microcomputer with a flash EEPROM according to a first embodiment of the present invention.

Referring now to FIG. 1, there is shown a microcomputer with a flash EEPROM according to a first embodiment of the present invention, comprising a system clock input terminal 1, a flash programming mode signal terminal 2, a communication mode selection signal input terminal 3, an automatic communication mode determining circuit 7, a communication mode signal bus 8, a data bus 9, a normal mode input buffer control signal bus 10, a flash EEPROM 11, a central processing unit (CPU) 12, terminal circuits 20-1 to 20-n, and terminal circuits 30-1 to 30-n.

System clock input terminal 1 receives a system clock signal 4. Flash programming mode signal input terminal 2 receives a flash programming mode signal 5 indicating a mode to rewrite data in flash EEPROM 11. Communication mode selection signal input terminal 3 receives a communication mode selection signal 6 including a string of pulse signals, the number of pulses corresponding to each communication mode.

Automatic communication mode determining circuit 7 is connected to input terminals 2 and 3 and determines a communication mode, generates a communication mode signal associated with the mode, and sends the signal onto communication mode bus 8.

Terminal circuits 20-1 to 20-n include terminals 21-1 to 21-n for which it is not known beforehand whether or not the terminals 21-1 to 21-n are used in accordance with a communication mode in the flash programming, selectors 23-1 to 23-n, and input buffers 22-1 to 22-n. Selectors 23-1 to 23-n receive an output from signal bus 8 and an output signal (input buffer control signal) from CPU12 via normal mode input buffer control signal bus 10 and select a communication mode signal when flash programming mode signal 5 is at an active level to deliver the signal as input buffer control signals 24-1 to 24-n. Input buffers 22-1 to 22-n respectively receive input buffer control signals 24-1 to 24-n. When signals 24-1 to 24-n are at an active level, input buffers 22-1 to 22-n respectively send the signals received by input terminals 21-1 to 21-n to data bus 9. When signals 24-1 to 24-n are at an inactive level, input buffers 22-1 to 22-n respectively turn off and send high-impedance outputs to data bus 9.

Terminal circuits 30-1 to 30-n respectively include terminals 31-1 to 31-n for which it is known beforehand that these terminals are not used in the flash programming mode, selectors 33-1 to 33-n, and input buffers 32-1 to 32-n. Selectors 33-1 to 33-n respectively receive input buffer inactive level signals 35-1 to 35-n and normal mode input buffer control signal 10 from CPU 12. When flash programming mode signal 5 is at an active level, selectors 33-1 to 33-n respectively select input buffer inactive level signals 35-1 to 35-n and output the signals as input buffer control signals 34-1 to 34-n, respectively. Input buffers 32-1 to 32-n receive signals from input terminals 31-1 to 31-n and input buffer control signals 34-1 to 34-n, respectively. When input buffer control signals 34-1 to 34-n are at an active level, input buffers 32-1 to 32-n output the signals of input terminals 31-1 to 31-n onto data bus 9. When input buffer control signals 34-1 to 34-n are at an inactive level, input buffers 32-1 to 32-n turn off and deliver high-impedance outputs to data bus 9.

Description will now be given in detail of constitution of automatic communication mode determining circuit 7.

Figure 2:
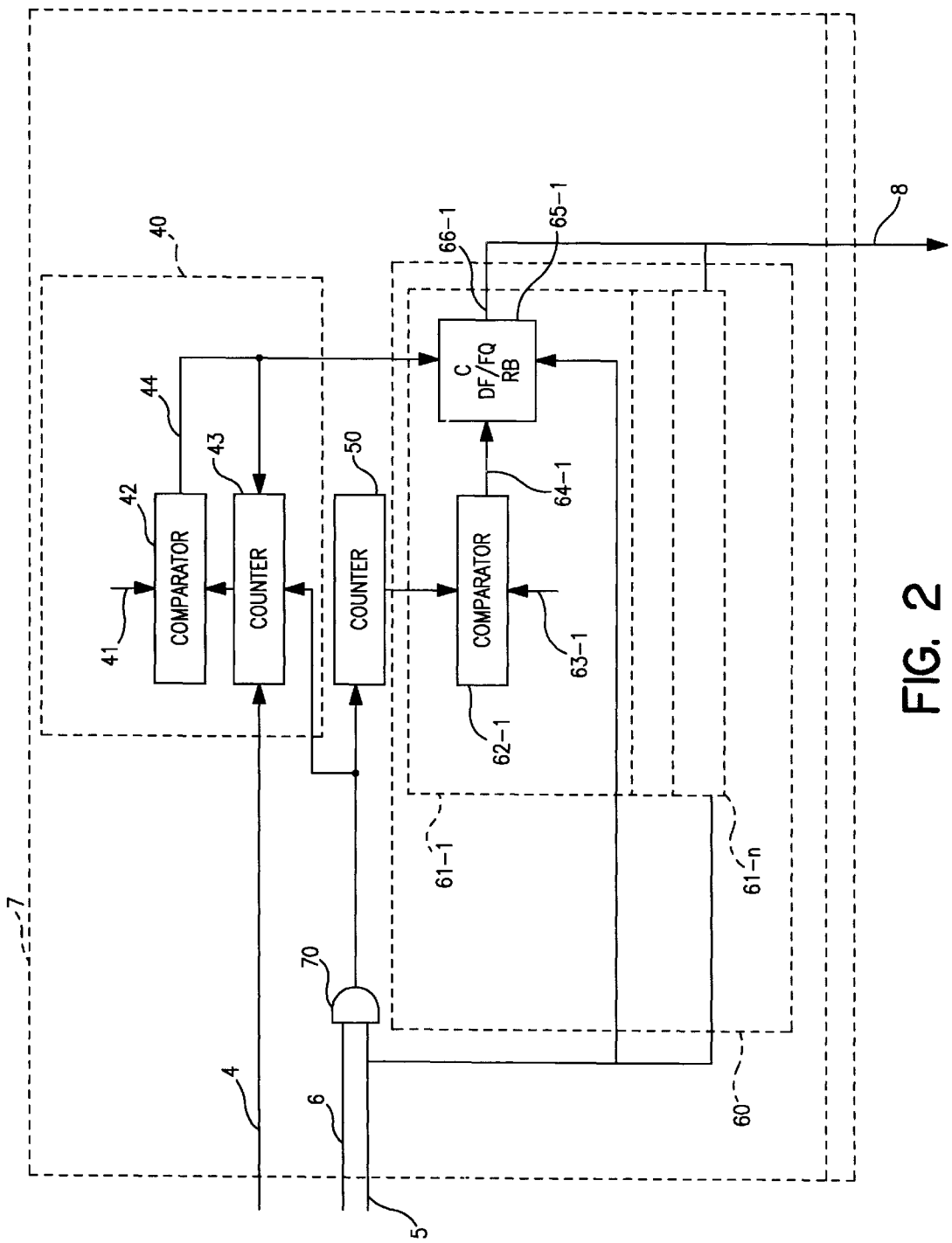
FIG. 2 is a block diagram showing an automatic communication mode determining circuit in FIG. 1.

Referring to FIG. 2, mode determining circuit 7 includes a counter 50, a time measuring circuit 40, a communication mode signal generating circuit 60, and an AND circuit 70.

AND circuit 70 receives a flash programming mode signal 5 and a communication mode selection signal 6 to output a logical conjunction of these signals.

Counter 50 counts the number of pulse signals from AND circuit 70 to produce a count value as a result.

Time measuring circuit 40 includes a comparator 42 and a counter 43. Counter 43 counts the pulse signals from a system clock circuit 4 to produce a count value. The count value is reset when the pulse signal from AND circuit 70 is at an inactive level or by matching signal 44. Comparator 42 compares the output value from counter 43 with a set value 41 and produces a matching signal when the values are equal to each other.

Communication mode signal generating circuit 60 includes, for example, n communication mode signal generators 61-1 to 61-n to discriminate n communication modes. Generators 61-1 to 61-n, i.e., communication mode signal 1 generator circuit 61-1 to communication mode signal n generator circuit 61-n include comparators 62-1 to 62-n and flip-flop circuits 65-1 to 65-n, respectively. Comparators 62-1 to 62-n compare an output value from counter 5 respectively with set values 63-1 to 63-n to output matching signals 64-1 to 64-n when the values compared match each other. Flip-flop circuits 65-1 to 65-n are released when flash programming mode signal 5 is set to an active level, from a reset state to respectively latch data of matching signals 64-1 to 64-n at timing when matching signal 44 is set to an active level and then respectively output the data as communication mode signals 66-1 to 66-n.

Figure 3:
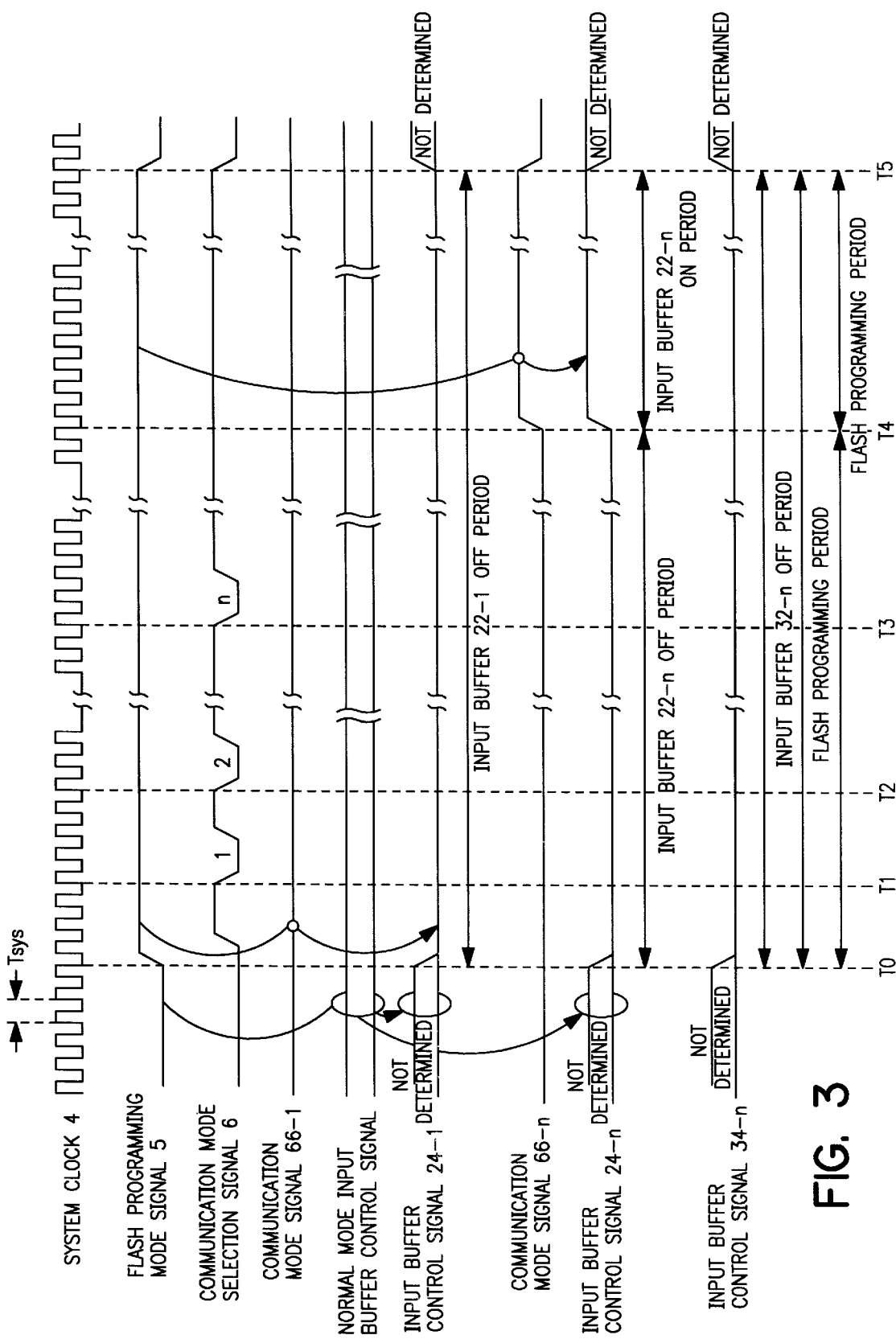
FIG. 3 is a signal timing chart for explaining operation of the embodiment shown in FIG. 1.

Operation of the first embodiment shown in FIG. 1 will be described with reference to FIG. 3.

When flash programming mode signal 5 is set to an active level at time T0, microcomputer 13 changes from the normal mode to the flash programming mode. The normal mode is a mode in which CPU 12 fetches an instruction code from flash EEPROM 11 to operate in accordance with the instruction. The flash programming mode is a mode to rewrite data in the flash EEPROM.

In the flash programming mode of this embodiment, it is assumed that the user can select either one of n communication methods, i.e., communication mode 1 to communication mode n to communicate programming data.

Automatic communication mode determining circuit 7 starts its operation when flash programming mode signal 5 becomes active and counts pulse signals of communication mode selection signal 6 for a period from time T0 to time T4. Circuit 7 determines a communication mode according to the count value and generates a communication mode signal to deliver the signal to communication mode signal bus 8. For example, when communication mode k is used, circuit 7 counts k pulse signals of selection signal 6 to accordingly determine a communication mode and sets communication mode signal 66-n to an active level for a period from time T4 to time T5 and the other communication mode signals to an inactive level. Circuit 7 then sends signal 66-n to mode bus 8.

Terminal circuits 20-1 to 20-n receive signals from CPU12 via normal mode input buffer control signal bus 10 and communication mode signal bus 8. When flash programming mode signal 5 becomes active at time T0, selectors 23-1 to 23-n select the signals from signal bus 8 to output the signals as input buffer control signals 24-1 to 24-n. For example, if terminal circuit 20-n alone is used when communication mode k is selected, control signals 24-1 to 24-n respectively from terminal circuits 20-1 to 20-n are inactive in a period from time T0 when the flash programming mode is set to time T4 when the communication mode is established. Input buffers 22-1 to 22-n thus turn off, preventing a current from flow through input buffers 22-1 to 22-n. During a flash programming period from time T4 to time T5, communication mode signal 66-n is fed from communication mode bus 8 to terminal circuit 20-n operating in the flash programming mode and is delivered as buffer control signal 24-n from selector 23-n to turn only input buffer 22-n on. Since input buffers associated with the other terminal circuits turn off, a current can be prevented from flowing through the input buffers.

In terminal circuits 30-1 to 30-n for which it is beforehand known that these circuits are not used in the flash programming mode, when flash programming mode signal 5 becomes active at time T0, selectors 33-1 to 33-n respectively select input buffer inactive level signals 35-1 to 35-n to output inactive level signals as input buffer control signals 34-1 to 34-n, respectively. During the period from time T0 to time T5, control signals 34-1 to 34-n are at an inactive level, which accordingly prevents a current from flowing through input buffers 32-1 to 32-n.

Operation of automatic communication mode determining circuit 7 will be described in detail with reference to FIG. 4.

Figure 4:
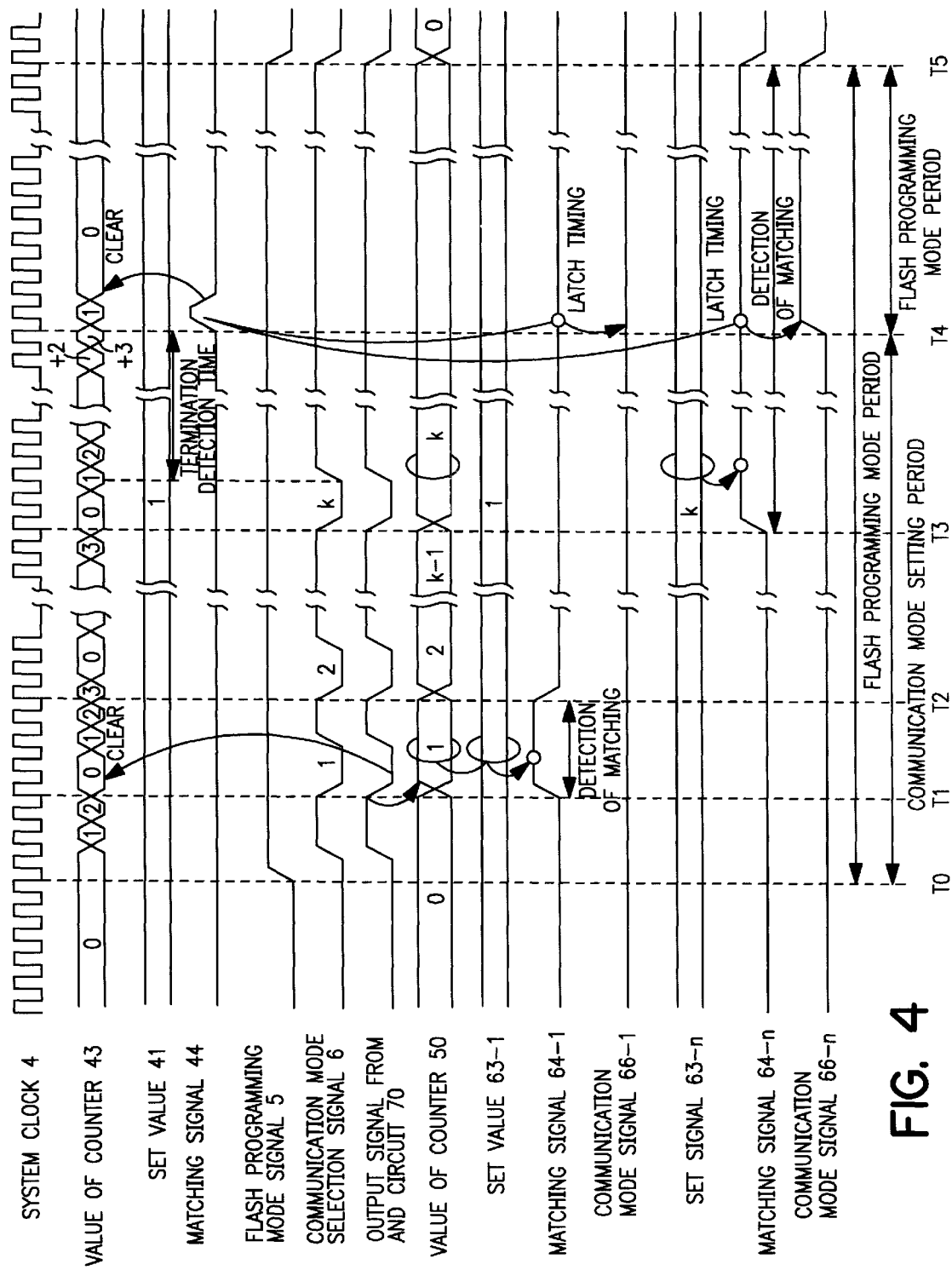
FIG. 4 is a signal timing chart for partly explaining operation of the embodiment shown in FIG. 1.

In the timing chart of FIG. 4, AND circuit 70 continuously outputs a signal at a level of communication mode selection signal 6 from time T0 when flash programming mode signal 5 becomes active to time T5 when signal 5 becomes inactive.

Counter 50 detects and counts falling edges of signals from AND circuit 70. When the signal from AND circuit 70 falls at timing of T1, counter 50, in response thereto, conducts its count operation, namely, a value of counter 50 becomes one. Similarly, the count value becomes two at timing of T2. Assume that a k-th pulse signal is received at timing of T3, the value of counter 50 becomes k. At time T5 when signal 5 goes inactive, counter 50 is reset to zero.

Time measuring circuit 40 achieves a main function to detect termination of the communication mode setting period. When circuit 40 detects no pulse signal of communication mode selection signal 6 for a predetermined period of time, the termination of the communication mode setting period is assumed. For example, when set value 41 is set to i and system clock signal 4 has a period of Tsys, if circuit 40 receives no pulse signal of communication mode selection signal 6 for a period of i x Tsys (from when the output signal from AND circuit 70 rises after T3 to time T4), the communication mode selection is terminated. Counter 43 operates using system clock signal 4 as its count clock signal when the signal from AND circuit 70 is active. Counter 43 is cleared to zero when the output signal is inactive. When the signal from AND circuit 70 goes active during a period from T0 to T1, counter 43 starts a count operation using system clock signal 4 as its counting clock signal. At T1 when communication mode selection signal 6 and the output signal from AND circuit 70 become inactive, counter 43 is cleared to zero. Thereafter, when the signal from AND gate 70 goes active, counter 43 starts again the count operation. Counter 43 cleared at T3 to zero starts the count operation when the signal from AND circuit 70 becomes active. If counter 43 receives no pulse signals of communication mode selection signal 6 for a predetermined period of time, counter 43 continues the count operation. When the count value is equal to i, comparator 42 detects a match between set value 41 and the value of counter 43 and then produces matching signal 44. In response thereto, counter 43 is cleared to zero and stops the count operation.

Communication mode signal 1 generator 61-1 includes comparator 62-1. Set value 63-1 is set to one, for example. At time T1 when the value of counter 50 becomes one, comparator 62-1 detects a match between set value 63-1 and the value of counter 50 and sets matching signal 64-1 to an active level. At T2 when the count value becomes two, comparator 62-1 sets matching signal 64-1 to an inactive level. At T4 when time measuring circuit 40 detects termination of the communication mode setting period and produces matching signal 44, flip-flop circuit 65-1 latches a level of matching signal 64-1 at the timing of the active level of matching signal 44 and then delivers the latched level as communication mode signal 66-1 to communication mode signal bus 8.

Communication mode signal n generator 61-n includes comparator 62-n. Assume that set value 63-n is set to k. At T3 when the value of counter 50 becomes k, comparator 62-n recognizes that set value 63-n is equal to the value of counter 50 and sets matching signal 64-n to an active level. In the period from T3 to T5, the counter value is k and hence matching signal 64-n is maintained active during a period from T4 to T5. At T4 when the time measuring circuit 40 detects termination of the communication mode setting period and outputs matching signal 44, flip-flop circuit 65-n latches matching signal 64-1 at the timing of the active level of matching signal 44. Flip-flop circuit 65 then delivers the latched level as communication mode signal 66-n to communication mode signal bus 8. Since set value 63-n is k, matching signal 64-n is active at T4. Flip-flop circuit 65-n therefore latches the active level to send the active-level signal as communication mode signal 66-n.

In the description of the first embodiment, one communication mode signal is used to control one terminal circuit. However, this does not restrict the present invention, namely, two or more terminal circuits may be controlled by one communication mode signal. Additionally, a two-input AND circuit is employed as the input buffer in the description. However, the number of input signals is not limited. That is, any input buffer capable of receiving input buffer control signals, for example, an OR-type input buffer may be utilized.

Second embodiment

Figure 5:
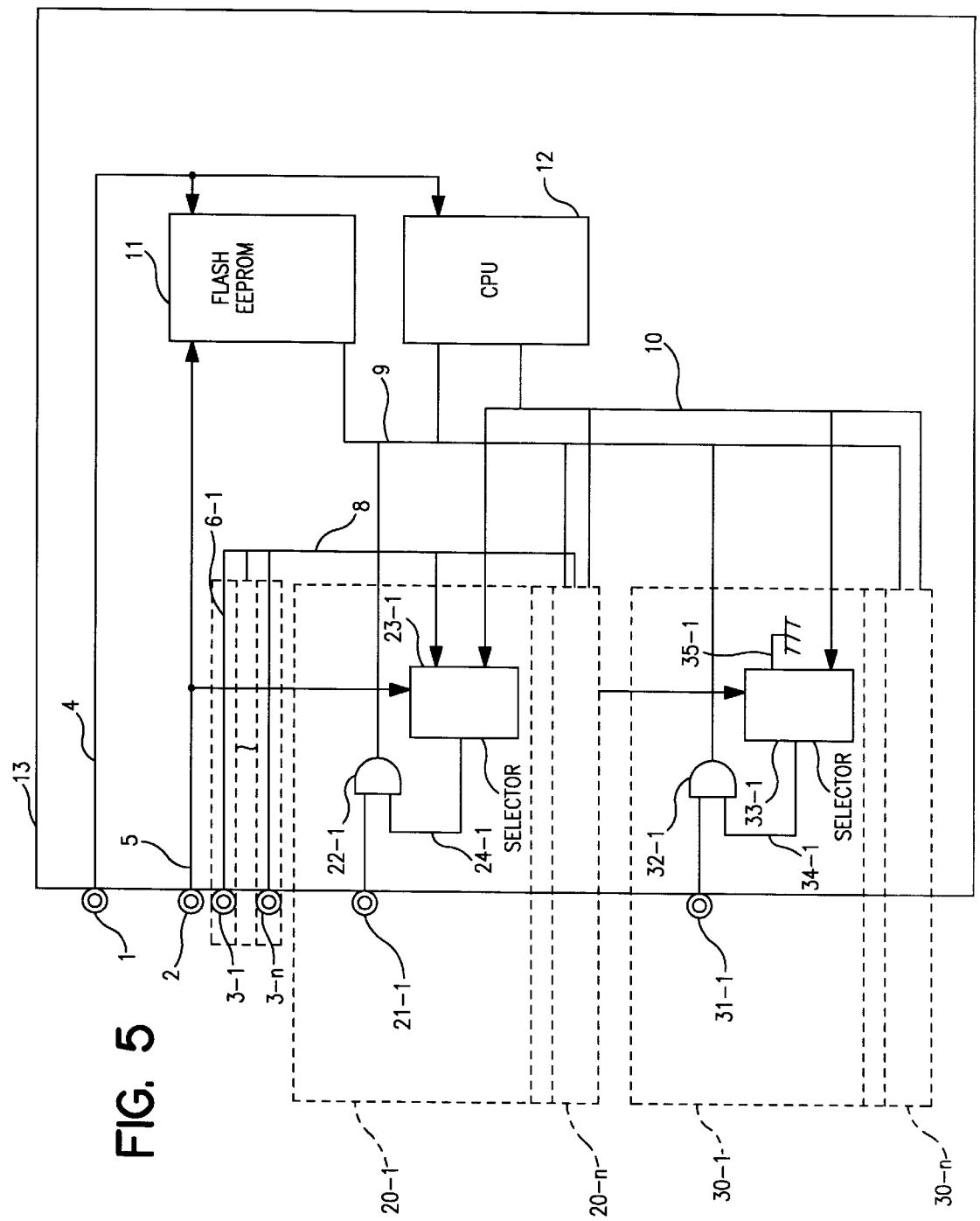
FIG. 5 is a block diagram showing a microcomputer with a flash EEPROM according to a second embodiment of the present invention.

Referring to FIG. 5, the second embodiment of the present invention includes communication mode selection signal input terminals 3-1 to 3-n. Communication mode selection signals from input terminals 3-1 to 3-n are fed to communication mode signal bus 8. To select, for example, communication mode n, only communication mode selection signal 6-n is set to an active level and the other communication mode selection signals are kept inactive. As a result, automatic communication mode determining circuit 7 to select a communication mode can be obviated.

Third embodiment

Figure 6:
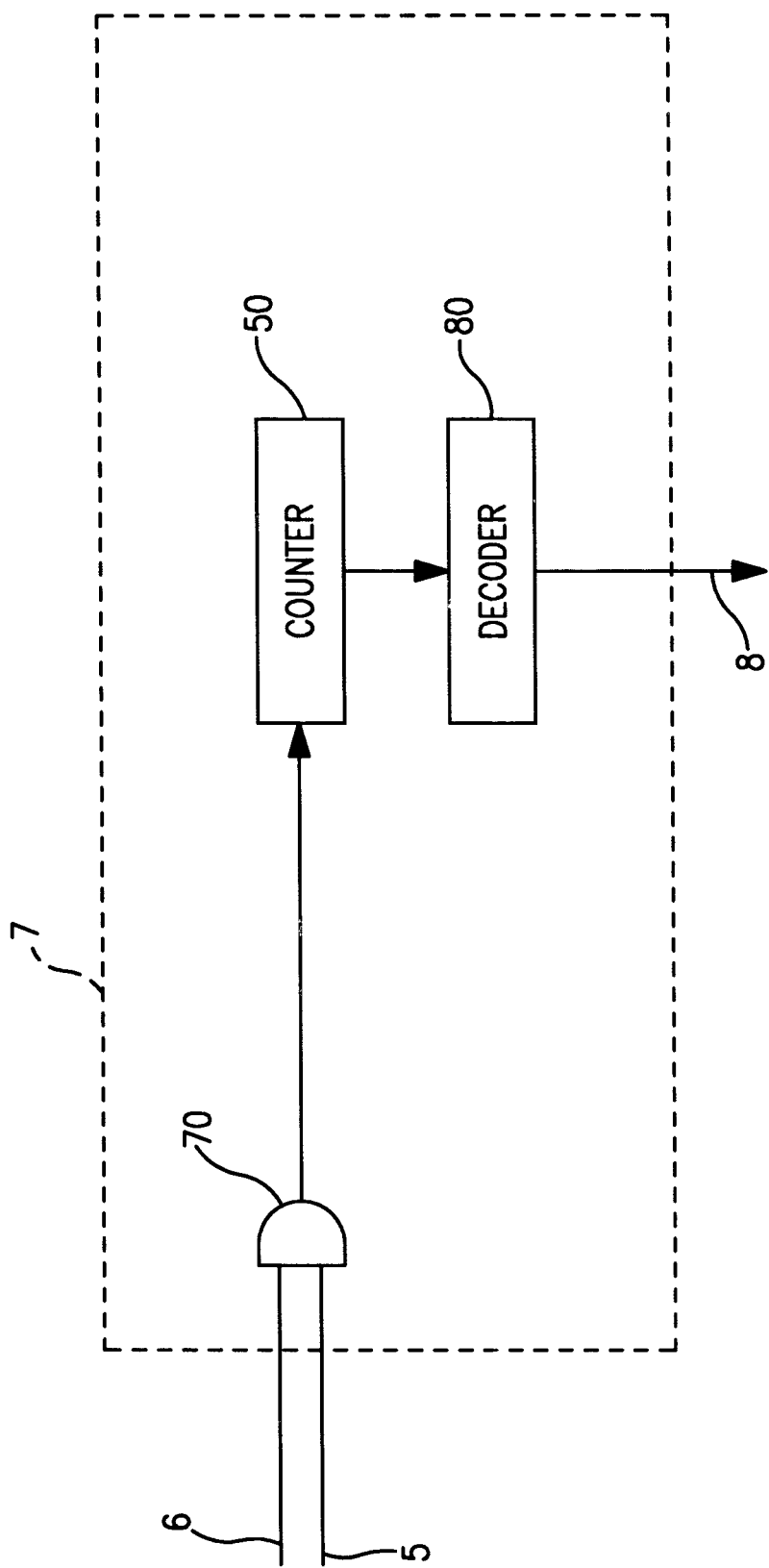
FIG. 6 is a block diagram showing a microcomputer with a flash EEPROM according to a third embodiment of the present invention.

In the third embodiment of the present invention shown in FIG. 6, automatic communication mode determining circuit 7 includes a decoder 80. Decoder 80 decodes a value produced from counter 50 to output a resultant value to communication mode signal bus 8. This advantageously reduces the number of circuit components.

While preferred embodiments of the present invention have been described using specific terms, such description is for illustrative purposes only, and it is to be understood that changes and variations may be made without departing from the spirit or scope of the following claims.

What is claimed is:

1. A microcomputer comprising:

a flash EEPROM;

input terminals associated with respective communication modes;

input buffers associated with respective input terminals;

an automatic communication mode determining circuit for determining a communication mode in a flash programming mode and for setting a communication mode signal of the communication mode thus determined to an active level; and control circuits associated with respective input terminals for setting in a flash programming mode, when a communication mode signal of a communication mode associated with the input terminal is at an active level, an input buffer associated with the input terminal to an active state.

2. A microcomputer according to claim 1, wherein said automatic communication mode determining circuit includes:

an AND circuit for receiving a flash programming mode
      signal and a communication mode selection signal
      including a pulse string of pulse signals corresponding
      to a communication mode and for ANDing the two
      signals;
   a first counter for counting pulse signals from said AND
      circuit to output a count value;
   a time measuring circuit including a second counter for
      counting pulse signals of a system clock signal, the
      count value being reset by a first matching signal and
      an inactive level of the pulse signal from said AND
      circuit, and a comparator for comparing a set value with
      the count value of the second counter and producing
      said first matching signal when the values match each
      other;
   a second comparator for comparing the count value of
      said first counter with a set value and producing a
      second matching signal when the values are equal to
      each other; and
   communication mode signal generators associated with
      respective communication modes whose reset state is
      released when the flash programming mode signal is set
      to an active level, for latching said second matching
      signal at timing when said first matching signal is set to
      an active level to activate a communication mode
      signal associated with the communication mode.

3. A microcomputer according to claim 1, wherein said automatic communication mode determining circuit includes:
   an AND circuit for receiving a flash programming mode
      signal and a communication mode selection signal
      including a pulse string of pulse signals, the number of
      pulses corresponding to a communication mode and for
      ANDing the two signals;
   a counter for counting pulse signals from said AND
      circuit; and
   a decoder for decoding the count value from the counter
      and for outputting a communication mode signal corresponding to said count value.

4. A microcomputer according to claim 1, wherein said control circuit compriese a selector for receiving a signal via a normal mode input buffer control bus from a central processing unit (CPU) and a communication mode signal of an associated communication mode from a communication mode signal bus, for selecting the communication mode signal of the associated communication mode when the flash programming mode signal becomes active, and for outputting the selected communication mode signal as an input buffer control signal to activate an input buffer associated with the communication mode.

5. A microcomputer according to claim 1, further comprising:
   at least one input terminal for which it is known beforehand that the input terminal is not used in the flash programming mode; and
   a control circuit for setting an input buffer associated with said input terminal in the flash programming mode to on inactive state.

6. A microcomputer comprising:
   a flash EEPROM;
   input terminals associated with respective communication modes;
   communication mode selection signal input terminals associated with respective communication modes for selecting an associated communication mode; and
   control circuits associated with respective input terminals for setting in a flash programming mode, when a communication mode signal from a communication mode selection signal input terminal of a communication mode associated with the input terminal is active, an input buffer associated with the input terminal to an active state.

7. A microcomputer according to claim 6, wherein said control circuit compriese a selector for receiving a signal via a normal mode input buffer control bus from a CPU and a communication mode signal of an associated communication mode from a communication mode signal bus, for selecting the communication mode signal of the associated communication mode when the flash programming mode signal becomes active, and for outputting the selected communication mode signal as an input buffer control signal to activate an input buffer associated with the communication mode.

8. A microcomputer according to claim 6, wherein said control circuit comprises a selector for receiving a signal via a normal mode input buffer control bus from a CPU and an input buffer active level signal, for selecting said input buffer active level signal when said flash programming mode signal becomes active, and for outputting the selected input buffer active level signal as an input buffer control signal to activate an input buffer associated with the communication mode.

9. A microcomputer according to claim 6, further comprising:
   at least one input terminal for which it is known beforehand that the input terminal is not used in the flash programming mode; and
   a control circuit for setting an input buffer associated with said input terminal in the flash programming mode to an inactive state.

* * * * *